United States Patent [19]

Gonzalez et al.

[11] 4,431,858

[45] Feb. 14, 1984

[54] METHOD OF MAKING QUASI-GRAIN BOUNDARY-FREE POLYCRYSTALLINE SOLAR CELL STRUCTURE AND SOLAR CELL STRUCTURE OBTAINED THEREBY

[75] Inventors: Franklin N. Gonzalez; Arnost Neugroschel, both of Gainesville, Fla.

[73] Assignee: University of Florida, Gainseville, Fla.

[21] Appl. No.: 377,558

[22] Filed: May 12, 1982

[51] Int. Cl.³ .................... H01L 31/06; H01L 31/18
[52] U.S. Cl. ...................................... 136/258; 29/572; 156/644; 156/647; 156/662; 357/30; 357/59
[58] Field of Search .................. 136/258 PC; 29/572; 156/644, 647, 662; 357/30, 59

[56] References Cited
U.S. PATENT DOCUMENTS

| | | | |
|---|---|---|---|
| 3,900,943 | 8/1975 | Sirtl et al. | 29/572 |
| 4,062,038 | 12/1977 | Cuomo et al. | 357/30 |
| 4,171,997 | 10/1979 | Irmler | 148/187 |
| 4,197,141 | 4/1980 | Bozler et al. | 136/258 |
| 4,219,368 | 8/1980 | David | 136/249 |
| 4,230,508 | 10/1980 | Lindmayer | 148/186 |
| 4,249,957 | 2/1981 | Koliwad et al. | 136/258 |
| 4,278,473 | 7/1981 | Borden | 136/249 |
| 4,283,589 | 8/1981 | Kaplow et al. | 136/249 |
| 4,320,168 | 3/1982 | Lindmayer | 428/332 |
| 4,366,338 | 12/1982 | Turner et al. | 136/258 |

OTHER PUBLICATIONS

K. P. Pande et al., "The Preparation & Properties of Thin Polycrystalline GaAs Solar Cells with Grain Boundary Edge Passivation", *IEEE Trans. Electron Devices,* vol. ED-27, pp. 635-640 (1980).

F. N. Gonzalez et al., "Design of Quasi-Grain-Boundary-Free (QGBF) Polycrystalline Solar Cells", *IEEE Electron Device Letters,* vol. EEL-2, pp. 141-143 (Jun. 1981).

*Primary Examiner*—Aaron Weisstuch
*Attorney, Agent, or Firm*—Kerkam, Stowell, Kondracki & Clarke

[57] ABSTRACT

A new solar cell structure is provided which will increase the efficiency of polycrystalline solar cells by suppressing or completely eliminating the recombination losses due to the presence of grain boundaries. This is achieved by avoiding the formation of the p-n junction (or other types of junctions) in the grain boundaries and by eliminating the grain boundaries from the active area of the cell.

This basic concept can be applied to any polycrystalline material; however, it will be most beneficial for cost-effective materials having small grains, including thin film materials.

12 Claims, 10 Drawing Figures

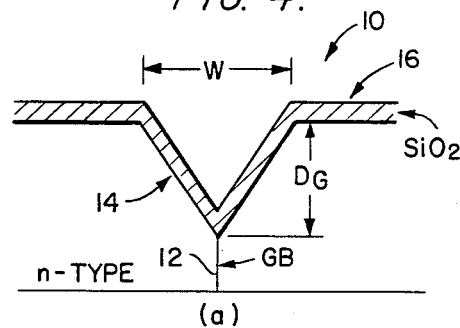
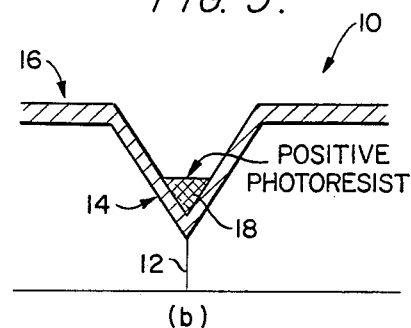
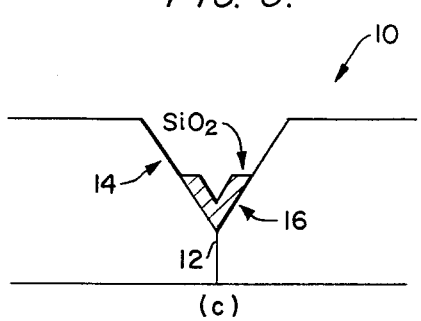
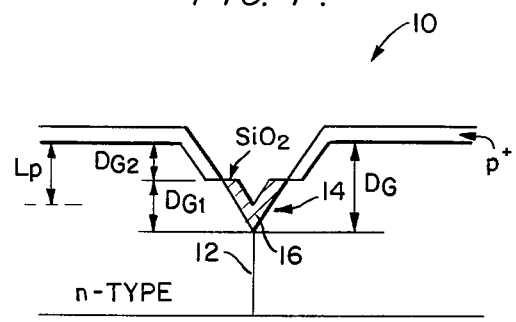
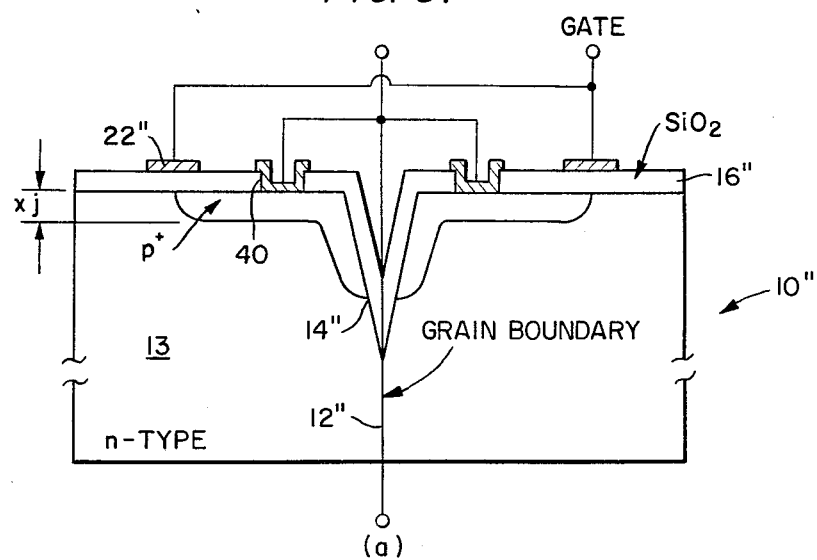

METHOD OF MAKING QUASI-GRAIN BOUNDARY-FREE POLYCRYSTALLINE SOLAR CELL STRUCTURE AND SOLAR CELL STRUCTURE OBTAINED THEREBY

This invention was made with Government support under SERI Contract Number XS-9-8275-1 awarded by the Department of Energy. The Government has certain rights in this invention.

TECHNICAL FIELD

This invention is directed to an improvided p/n junction photodiode of polycrystalline material having electrical performance comparable to single crystal photodiodes.

BACKGROUND OF THE PRIOR ART

In order for polycrystalline solar cells to be cost-effective for terrestrial applications, their cell efficiency must be considerably increased from its present values. This is especially true for thin film solar cells. It is known that the efficiency of polycrystalline solar cells is severely impaired by the presence of the grain boundaries and their influence on carrier recombination.

One category of previous attempts to diminish their influence has focused on their passivation through the positioning of atoms (hydrogen, phosphorous, etc.) that are expected to tie up the dangling bonds at the interface states located at the grain boundaries. Another method reduces the importance of these grain boundaries losses by making grain sizes much larger than the minority carrier diffusion length; but this approach may imply high material cost.

BRIEF SUMMARY OF THE INVENTION

It is an object of the invention to provide a new, cost-effective method that will drastically reduce, and in some circumstances practically eliminate, the degrading grain boundary effects. The method both reduces recombination losses and increases current collection.

The quasi-grain-boundary-free polycrystalline cells are formed by preferentially etching a region close to the grain boundary which creates grooves between the neighboring grains. The bottom of the groove is covered with $SiO_2$. This prevents the subsequent emitter diffusion from forming junctions that intersect the grain boundaries. Since there is no p/n junction at the grain boundaries, the component of the recombination current in the space-charge region of the p/n junction at the grain boundary surfaces is completely eliminated. This current component has been identified as a very important degrading effect on the conversion efficiency achievable in polysilicon solar cells. For the optimal cell, the minority carriers injected from the emitter will not reach the grain barriers, which will be more than a minority-carrier diffusion length away from the nearest injecting surface of the emitter junction.

BRIEF DESCRIPTION OF THE DRAWINGS

The invention will be more particularly described in reference to the accompanying drawings wherein:

FIGS. 4, 5, and 6 illustrate basic processing steps in fabricating a quasi-grain-boundary-free polycrystalline solar cell;

FIG. 7 is a cross sectional view of the solar cell structure after emitter difussion;

FIG. 8 is a diagramatic illustration of a test solar cell constructed to determine the effectiveness of the process of the invention;

DETAILED DESCRIPTION OF THE INVENTION

Figure 3:
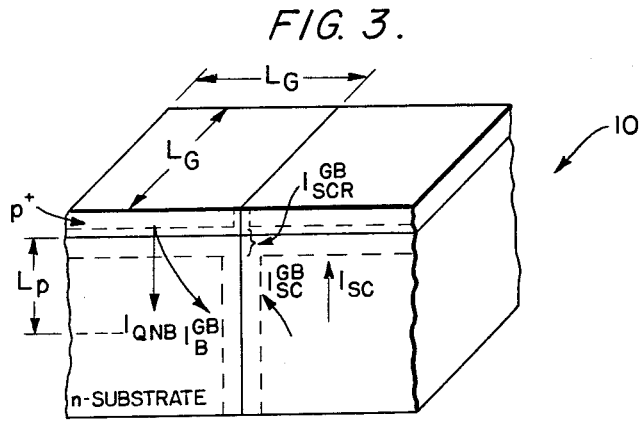
FIG. 3 illustrates, diagramatically, a portion of a conventional p/n junction polycrystalline cell with one columnar grain boundary.

The grain boundaries in a polycrystalline solar cell influence its performance by increasing the dark current, reducing the photocurrent, reducing the fill factor, and decreasing the shunt resistance. FIG. 3 illustrates the effects of the grain boundaries on these parameters. Consider first the holes injected in the dark from the top p+/n junction, which will recombine both in the n-type bulk and at the grain boundary. The intragrain current component $I_{QNB}$ will dominate the total dark current $I_D$ if the grain size $L_G$ is much larger than the hole diffusion length $L_p$, i.e., $L_G >> L_p$. If, however, $L_G \lesssim L_p$ the grain boundaries component of the dark current $I_B{}^{GB}$ becomes important. The dark current can then be characterized by an effective hole diffusion length, $L_{eff}$, related to the effective lifetime $\tau_{eff}$ derived in Shockley's first order filament theory; $L_{eff} \leq L_p$. Another grain boundary component of dark current, $I_{SCR}{}^{QB}$, is due to the recombination at the grain boundary within the junction space-charge-region. This current component can be important even in cases where $L_G > L_p$ if the grain boundary surface recombination velocity $S_{GB}$ is large. In addition to grain boundary effects on the dark current, the terminal short-circuit current $I_{sc}$ will be reduced, because a portion of the minority holes photogenerated within a distance of about $L_p$ from the grain boundaries can recombine at the grain boundaries. This component is designated as $I_{sc}{}^{GB}$ in FIG. 3. The fill factor FF is decreased by the grain boundaries shunt resistance $R_{sh}{}^{GB}$ and also by the $I_{SCR}{}^{GB} \alpha \exp(qV/m_x KT)$ with $m_x \simeq 2.0$; in contrast to $I_{QNB} \alpha \exp(qV/mKT)$ with $m \simeq 1.0$ for the idealized single crystal case. In the above discussion we assumed that the emitter current components are negligible.

The present invention provides a structure which eliminates all of the grain boundaries current components and also eliminates the grain boundaries shunt resistance. This new quasi-grain-boundary-free (QGBF) polycrystalline solar cell is shown schematically in FIGS. 1 and 2.

Referring now to FIGS. 1, 4, 5, 6, and 7, reference numeral 10 generally denotes a p/n junction photodiode fabricated on Wacker polysilicon material having quasi-grain-boundary-free characteristics.

Using a suitable chemical etch, a preferential etching will take place along the grain boundaries 12, creating V-grooves 14 with a depth $D_G$ between grains; the grain boundaries are removed from the top planar surface. The walls of the groove are then covered with thermal $SiO_2$ 16 assuring very low surface recombination velocity at the walls. The p+ emitter diffusion covers only the top of the device and a top portion of the groove. There is no p+ diffusion and no p-n junction in the grain boundaries.

By using a suitable etchant such as $HF:HNO_3:H_2O$ (2:4:4 volume ratio) with 0.4 gram of $AgNO_3$ per 10 m/ of solution a preferential etching will take place along the grain boundaries, creating the V-grooves 14 between grains; the grain boundaries are on the apex of the grooves. The width W and depth $D_G$ of these grooves depend both on etching time and grain orientation. After this etching, a masking oxide such as $SiO_2$ is deposited either by thermal oxidation or by chemical vapor deposition. The next step is the removal of the oxide from everywhere except the bottom of the V-grooves. This is done through the use of positive photoresist 18 which when deposited properly, will be thicker in the bottom of the V-grooves than anywhere else; then by illuminating the wafer 10 with UV light (without any mask) only the thinner photoresist is exposed, developed, and removed, leaving photoresist 18 covering the bottom of the grooves. The oxide from areas not protected by the photoresist is etched away and boron is diffused to form the p+ emitter in the exposed Si; the remaining oxide will mask against diffusion in the grain boundaries. The deposition of conductive layer 19, such as ITO(Indium-tin oxide) or $SnO_2$, and antireflecting coating 20 are the same as for a conventional cell.

The process with $SiO_2$ covering the bottom of the grooves will create isolated emitter islands which have to be interconnected by the metal fingers 22 formed in openings 40 in the anti reflection coating 20 or 30 in order to collect all available photocurrent. This requires that the distance between the metal fingers be equal or smaller than the grain size. This may be a problem for small-grain material where some of the grains may be left isolated. The effect of these isolated grains on the electrical performance will be to reduce the total $I_{sc}$, but the $V_{oc}$ and the fill factor will be minimally affected.

One has a possible design option that would increase $I_{sc}$ by a collection of carriers from the isolated grains. In this regard, note that the effective surface recombination velocity $S_E$ of the isolated-grain p-n junction will be small and that, if the surface recombination velocity of the grain boundary surfaces below the groove is small enough, this would permit minority-carrier transfer from the isolated grain into adjacent collecting grains. This consideration would affect, in fact, the choice of $D_G$. Another design option involves using a transparent conductive layer, such as a heavily-doped CVD polysilicon layer 30 (FIG. 3).

It has been found that about 10 minutes etching time is necessary to obtain $D_G \simeq 10$ microns. Using this procedure, it is possible to cover about 80% of the grooves with $SiO_2$. Another way to obtain the desired masking $SiO_2$ on top of the grain boundaries is to use chemical vapor deposition (CVD) of $SiO_2$ which will be thicker at the bottom of the groove than anywhere else due to the overlapping of the layers deposited on the walls at the bottom of the groove. This will allow the removal of the oxide from the top flat regions just by properly controlling the etching time. The CVD $SiO_2$ layer can be deposited on top of a high quality thermal oxide to assure low surface recombination velocity.

Referring again particularly to FIG. 7, the mechanisms by which the quasi-grain-boundary-free structure eliminates all the grain boundary current components associated with the conventional cell shown will now be discussed.

Provided the cell thickness exceeds $L_p$, the photogenerated minority holes that are at a distance roughly equal to $L_p$ from the top junction will be collected by that junction. If $D_G \gtrsim L_p$ there will be almost no loss of $I_{sc}$ due to recombination at the walls of the groove because of the low surface recombination velocity of the thermal $SiO_2$. The top portion of the walls, $D_{G2}$ in FIG. 7 covered with the p+/n junction, will increase the collection area. The $I_{SCR}^{GB}$ component of the dark current is eliminated, since there is no p-n junction in the grain boundary. The dark current recombination at the walls is again small because of the thermal $SiO_2$. The dark hole current injected from the p+/n junction along the walls of the groove will partly recombine in the grain (within a distance $L_p$) and partly in the grain boundary if $D_G$ is smaller than $L_p$.

The structure will then behave as a grain-boundary-free cell where the dominant dark current component is the one-dimensional intragrain current $I_{QNB}$. The oxide layer on the bottom of the groove will completely eliminate the shunt resistance effects of the grain boundary. The recombination at the grain boundary within the emitter is also completely eliminated.

The new structure will be most beneficial for small grain materials in which the negative effects of the grain boundaries are more dominant than they are for large grain size materials. One of the most important parameters in the quasi-grain-boundary-free structure is the depth $D_G$ at which the grain boundaries will be located below the top p+/n junction. A maximum efficiency can be achieved for $D_G \gtrsim L_p$, or $D_G \gtrsim L_a$, where $L_a$ is the thickness needed to collect most of the photogenerated carriers. In silicon, these conditions would require $D_G \simeq 30$ to 50 microns. However, $I_{SCR}^{GB}$ and grain boundary shunt resistance will be eliminated regardless of the magnitude of $D_G$. This can improve the fill factor even for cases when $D_G < L_p$. The quasi-grain-boundry-free cell can have a major impact for small grain thin film polycrystalline direct band-gap materials, such as GaAs, in which both $L_p$ and $L_a$ are between 2 and 10 microns. In conventional cells made from these materials the $I_{SCR}^{GB}$ will be the dominant dark current component which will strongly decrease $V_{oc}$. Here we can approach efficiencies close to that of the single crystal material.

Figure 1:
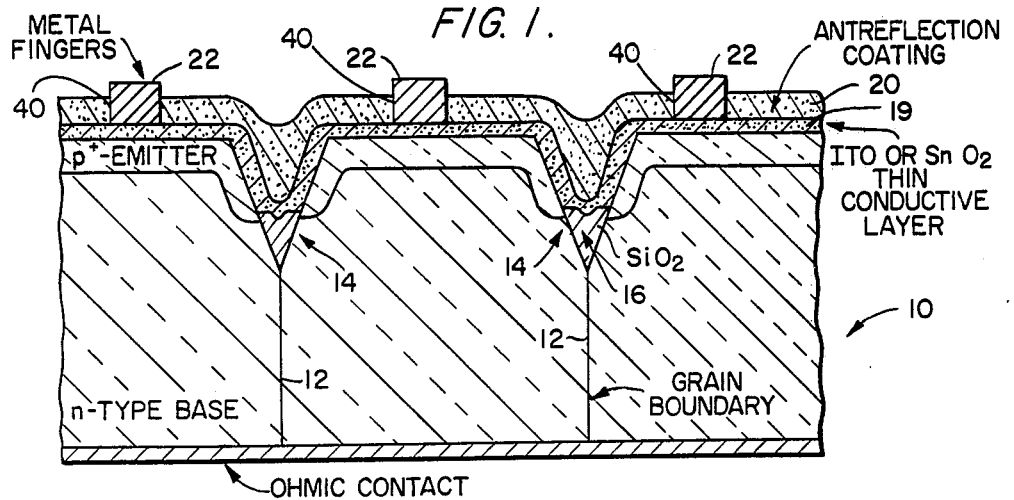
FIG. 1 illustrates a portion, greatly enlarged, of a quasi-grain-boundary-free solar cell showing electrical connection of the isolated islands formed by etching with a thin tin oxide or indium-tin oxide (ITO) conductive layer.
Figure 2:
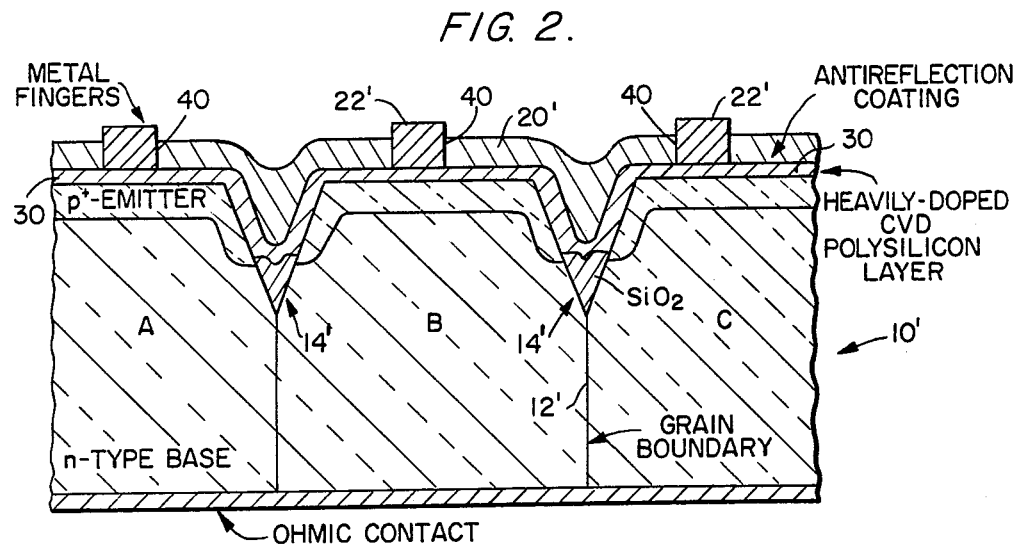
FIG. 2 is a view like FIG. 1 illustrating connection of isolated islands between etched grain boundaries by a thin heavily-doped chemical vapor deposited polysilicon.

The solar cell 10' illustrated in FIG. 2 is similar to the cell 10 previously described and primed reference characters designate similar structures in FIG. 1. The primary difference between the two cells is that 10' employs a heavily-doped chemical vapor deposited polysilicon layer 30 to connect the isolated islands A, B, and C etc. rather than thin conductive tin oxide or indium-tin oxide layer 16 of the FIG. 1 form of cell.

EXAMPLE

Figure 9:
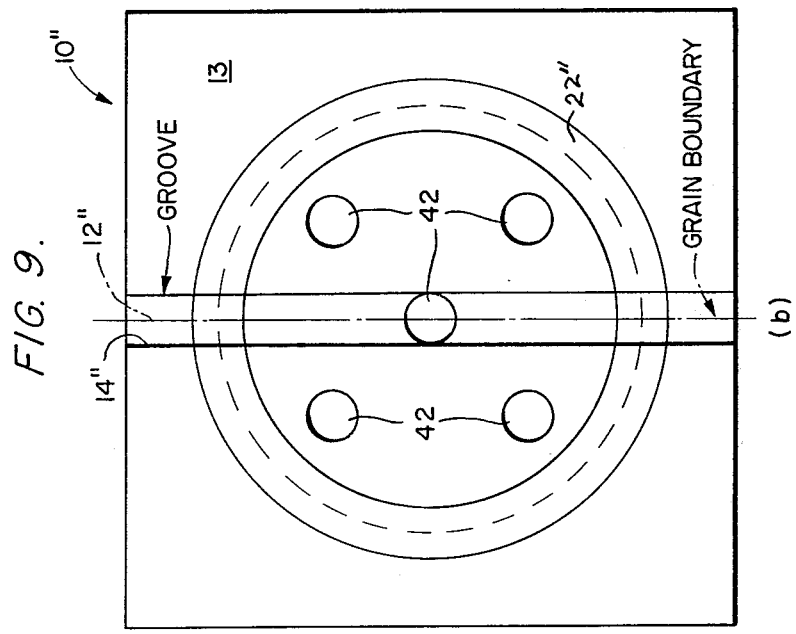
FIG. 9 is a top elevational view of the cell illustrated in FIG. 8.

Electrical measurements of the improved cell will be described in reference to FIGS. 8, 9, and 10.

FABRICATION

The p+/n cells 10" used are small-area devices, 30 mils in diameter, with only a few grain boundaries within the device area. FIGS. 8 and 9 show the cross section and the top view of the quasi-grain-boundary-free cell structure with one grain boundary 12″ crossing through the middle. The substrate 13 was 2 Ω-cm n-type Wacker polysilicon. Use of these small-area devices also allows better control of the groove coverage by $SiO_2$. The wafers were 2×2 cm in size and each wafer contained 400 small-area devices.

The preferential etching of the top side was done using HF:HNO$_3$:H$_2$O (2:4:4 volume ratio) with 0.4 gram of AgNO$_3$ per 10 ml of etching solution. This etching solution was found to etch preferentially the grain boundaries without causing any damage to the surface within the grains. Etching in the preferential solution for 7 minutes removed about 2 mils of Si from the top and produce grooves 14″ with various widths and depths (5 μm–40 μm) depending on the crystallographic orientation of the grains. The next step was a wet oxidation to obtain about 6000 Å of thermal $SiO_2$ 16″ on the top area. The photoresist step was done using Shipley positive photoresist spun at 900 RPM on the 2×2 wafer. Then an emitter boron predeposition done at 925° C. for 45 minutes (using a solid boron nitride source) was followed by a drive-in at 1000° C. for 30 minutes. An about 1500 Å thick layer of $SiO_2$ was grown during the drive-in step. After opening holes 40 in the $SiO_2$ for contacts, a 6500 Å Aluminum layer was evaporated and sintered at 450° C. for 15 minutes. The metal contacts consisted of five circles 42 that cover about 20% of the cell 10″, and annular contact 22″.

A summary of measured electrical parameters for several representative cells chosen from 100 measured devices is given in Table I.

TABLE I

Geometrical and electrical parameters of p+/n solar cells. The total length of grain boundries within the cell is denoted by $l_{GB}$. The cell area is A = 4.6 × 10$^{-3}$cm$^2$. The two-dimensional effects of $V_{OC}$ and $J_{SC}$ are negligible because of a large ratio of cell diameter (760 μm) to $L_p \simeq 65$ μm. $V_{OC}$ and $J_{SC}$ were measured at 1 sun AM0 illumination at 25° C.

| Cell # | Description | $l_{GB}$ (mils) | coverage by $SiO_2$ | $V_{OC}$ (mV) | $J_{SC}$ (mA/cm$^2$) | FF | $S_{GB}$ (cm/sec) |
|---|---|---|---|---|---|---|---|
| 1 | Grainy | 32 | 0 | 494 | 29.6 | 0.70 | 7 × 10$^5$ |
| 2 | Grainy | 23 | 0 | 512 | 25.1 | 0.70 | 4.2 × 10$^5$ |
| 3 | GBF | — | — | 528 | 28.0 | 0.80 | — |
| 4 | QGBF | 74 | 87 | 523 | 27.0 | 0.79 | — |
| 5 | QGBF | 52 | 100 | 542 | 30.0 | 0.80 | — |

Figure 10:
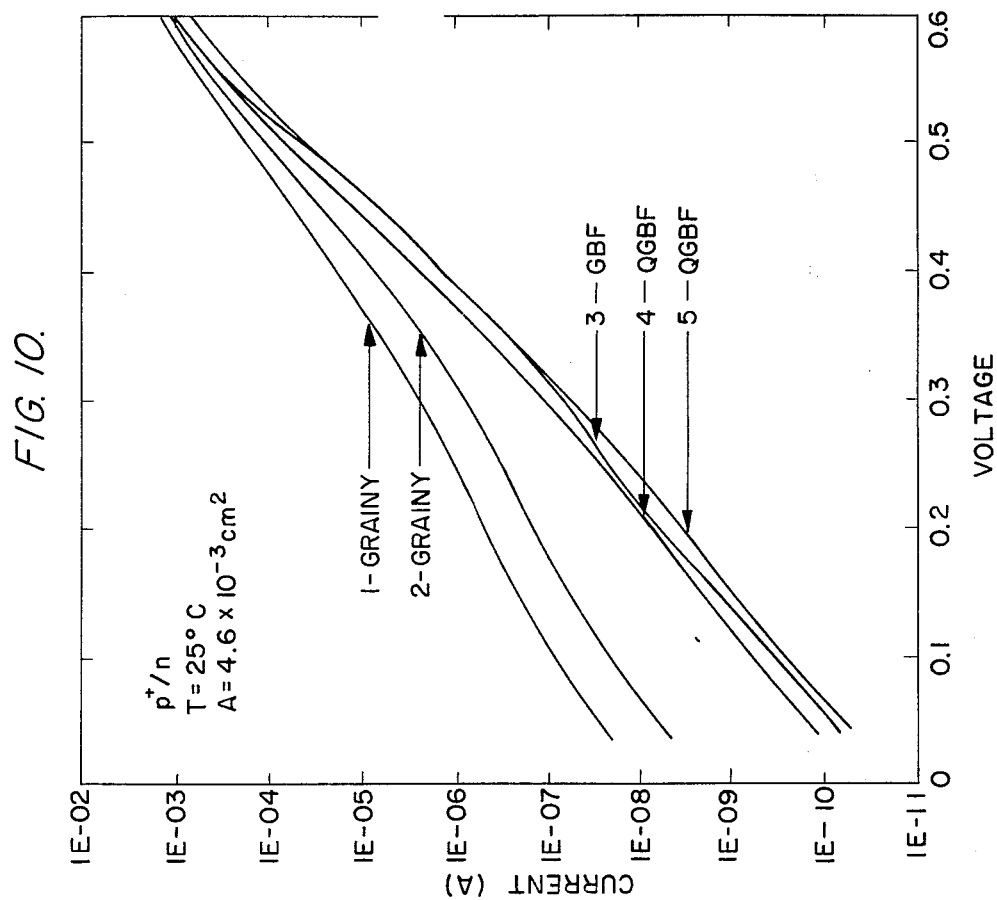
FIG. 10 is a graph illustrating measured dark current-voltage characteristics for 5 p/n solar cells constructed in accordance with the teachings of the present invention compared with grainy cells and grain-boundary-free cells.

FIG. 10 shows the measured current-voltage (I-V) characteristics of these devices. Curve 3 is the I-V plot for the reference grain-boundary-free cell which is placed within the grain and thus contains no grain boundaries. This cell is used to: (a) measure the intragrain doping and diffusion length, and (b) provide a reference cell for comparison with the grainy cells. Curves 1 and 2 are for grainy cells, both with two grain boundaries. Comparison of curves 1 and 2 with 3 shows a very strong influence of the grain boundaries on the I-V characteristics. The increase in the dark current at small bias is about two orders of magnitude. The I-V dependence for the grainy diode is a strong function of the number of grain boundaries within the diode. The common feature of all grainy diodes is, however, at least one decade increase in current at V ~ 0.2 V. This increase in the dark current is due to the component of recombination current that originates from deep-level recombination centers at the grain boundary within the junction space-charge-region (SCR). We denote this component by $I_{SCR}^{GB}$. The conclusion that $I_{SCR}^{GB}$ dominates is based on the value of the activation energy of this current component which was found to be very close to $E_g/2$, as expected for the SCR recombination current proportional to $n_i$. The $I_{SCR}^{GB}$ current component is expected to be the dominant degrading factor in solar cells made from small-grain polysilicon and possible other polycrystalline material. This conclusion is further indicated, for example, by close inspection of the I-V curve 1 for a representative grainy diode with tow grain boundaries having a total length $l_{GB} \simeq 32$ mils within the 760 μm diameter cell. The SCR recombination current $I_{SCR}^{GB}$ is still very important even at V≃−$V_{OC}$=494 mV. The reciprocal slope factor of the I-V curve at V≃$V_{OC}$ is $m_x \simeq 1.9$, showing that the $V_{OC}$ is determined almost completely by the SCR recombination and not by the quasi-neutral recombination. This is not true of a grain-boundary-free diode. Therefore, for grain sizes smaller than those simulated by our 30-mil diodes, $I_{SCR}^{GB}$ is expected to be even more important and will further degrade the cell performance.

The recombination current component $I_{SCR}^{GB}$ can be expressed as:

$$I_{SCR}^{GB} \simeq A_{SCR}^{GB} q \, n_i \, S_{GB} \exp(qV/m_x^{GB} kT) \quad (1)$$

where $S_{GB}$ is the grain boundary surface recombination velocity within the junction SCR, $A_{SCR}^{GB} \simeq 2 l_{GB} W_{SCR}^{GB}$, in which $l_{GB}$ is the total grain boundary length and $W_{SCR}^{GB}$ is the approximate width of the junction SCR at the grain boundary. Using (1) for the measured I-V curve of cells 1 and 2, and using $W_{SCR}^{GB} \simeq 0.5$ μm, we calculate $S_{GB} \simeq 7 \times 10^5$ cm/sec and $4.2 \times 10^5$ cm/sec respectively, and $m_x^{GB} \simeq 2.0$. The values for $S_{GB}$ measured on the grainy diodes ranged from $2 \times 10^5$ cm/sec to $2 \times 10^6$ cm/sec. It is important to compare this value with $S_{GB} \simeq 2 \times 10^4$ cm/sec for similar n+/p devices made on 5 Ωcm Wacker p-type substrates. This comparison suggests that small-grain n+/p solar cells on Si having grain boundaries like those in Wacker Si will yield better efficiency than comparable p+/n cells.

By inspection of curves 4 and 5 for two representative quasi-grain-boundary-free cells, we now demonstrate the advantages of the quasi-grain-boundary-free structure. Cell 5 has its grain boundaries completely covered by $SiO_2$, cell 4 has 87% of its grain boundaries covered by $SiO_2$. Note that the I-V curves for the grain boundary free and the two quasi-grain-boundary-free cells are almost identical. The main structural difference between the grainy cells 1 and 2 and the quasi-grain-boundary-free cells 4 and 5 is the absence of a p/n junction at the grain boundaries. This proves that the excess current in the 0<V<≲400 mV range for the grainy diodes is due to the $I_{SCR}^{GB}$, as was previously indicated by the activation energy of $I_{SCR}^{GB}$.

Other degrading grain boundary current components have to be also considered.

The intragrain doping density and hole diffusion length was measured on the grain boundary free diode 3. The doping obtained by $1/C^2$ vs $V_R$ dependence was $N_{DD} \simeq 2.3 \times 10^{15}$ cm$^{-3}$, and $L_p \simeq 65$ μm was calculated from the dark I-V curve and from the forward-bias small-signal capacitance method. The average grain size in diodes 1, 2, 4, and 5 exceeds $L_p$; therefrom the recombination at the grain boundaries in the quasineutral bulk will not be the dominant grain boundary current component. Therefore the values for $I_{SC}$ and $V_{OC}$ for cells 3–5 are about equal. This is consistent with the measured values shown in Table I. Small variations in $V_{OC}$ are due mainly to the observed variations in $N_{DD}$ ($1.5 \times 10^{15}$ cm$^{-3}$ to $2.3 \times 10^{15}$ cm$^{-3}$) and $L_p$ (45 μm to 70 μm). $V_{OC}$ for cells 1 and 2 is smaller because of the influence of $I_{SCR}^{GB}$. Note the relatively small fill factor FF for cells 1 and 2, also due to $I_{SCR}^{GB}$.

The summary of measured values for $V_{OC}$ is in Table II. The values for $V_{OC}$ in the grainy diodes decreased with increased total length of grain boundaries, $l_{GB}$. The values of $J_{SC}$ ranged from about 25 mA/cm$^2$ to about 30 mA/cm$^2$ for all types of devices in Table II.

TABLE II

Range of measured values of $V_{OC}$ (AMO, 25° C.). The quasi-grain-boundary-free cells measured had at least 85% groove coverage by SiO$_2$.

| Description of cells | $V_{OC}$ (min) (mV) | $V_{OC}$ (max) (mV) | $V_{OC}$ (av) (mV) |
|---|---|---|---|
| Grainy | 466 | 518 | 505 |
| QGBF | 528 | 543 | 536 |
| GBF | 528 | 538 | 534 |

We claim:

1. A p/n junction photodiode-type solar cell comprising a body of polycrystalline semiconductor material having a surface adapted to receive incident radiation and a p/n junction generally parallel to said surface wherein the degrading effects of grain boundaries on the diode performance are substantially eliminated by preferentially etched grooves in said surface between neighboring grains, a non-conductive coating on the bottom of each said groove which interrupts the p/n junction at the grain boundaries, and electrical conductors on said surface electrically connecting areas isolated by said grooves.

2. The photodiode defined in claim 1 wherein the polycrystalline semiconductor material comprises polysilicon.

3. The photodiode defined in claim 2 wherein the non-conductive coating comprises SiO$_2$.

4. The photodiode defined in claim 3 further including a conductive layer of tin oxide over said surface including the SiO$_2$ coated etched grooves.

5. The photodiode defined in claim 3 further including a conductive layer of indium-tin oxide over said surface including the SiO$_2$ coated etched grooves.

6. The photodiode defined in claim 3 further including a conductive layer of heavily-doped polysilicon over said surface including the SiO$_2$ coated etched grooves.

7. A method of making a p/n junction photodiode-type solar cell from polycrystalline semiconductor material, comprising the steps of: preferentially etching grooves in one surface of the material between neighboring crystal grains; applying a non-conductive coating to the bottom of each of the etched grooves; and applying to said one surface electrical conductors to connect surface areas isolated by the etched grooves.

8. A method of making a p/n junction photodiode-type solar cell from polysilicon material, comprising the steps of: preferentially etching grooves in one surface of the material between neighboring crystal grains; applying a non-conductive coating to the bottom of each of the etched grooves; and applying to said one surface electrical conductors to connect surface areas isolated by the etched grooves.

9. A method of making a p/n junction photodiode-type solar cell from polysilicon material, comprising the steps of: preferentially etching grooves in one surface of the material between neighboring crystal grains; applying a non-conductive SiO$_2$ coating to the bottom of each of the etched grooves; and applying to said one surface electrical conductors to connect surface areas isolated by the etched grooves.

10. The method defined in claim 9 further including the step of applying a conductive coating of tin oxide on the etched surface of the material including the SiO$_2$ coated etched grooves.

11. The method defined in claim 9 further including the step of applying a conductive coating of indium-tin oxide on the etched surface of the material including the SiO$_2$ coated etched grooves.

12. The method defined in claim 9 further including the step of applying a conductive coating of heavily doped polysilicon on the etched surface of the material including the SiO$_2$ coated etched grooves.

* * * * *